(12) United States Patent
Lee et al.

(10) Patent No.: US 11,183,554 B2
(45) Date of Patent: Nov. 23, 2021

(54) DISPLAY DEVICE AND METHOD OF MANUFACTURING THE DISPLAY DEVICE

(71) Applicant: Samsung Display Co., Ltd., Yongin-Si (KR)

(72) Inventors: Dongmin Lee, Anyang-si (KR); Sangwoo Sohn, Yongin-si (KR); Sukyoung Yang, Hwaseong-si (KR); Dokeun Song, Yongin-si (KR); Kyeong Su Ko, Hwaseong-si (KR); Sanggab Kim, Seoul (KR); Sangwon Shin, Yongin-si (KR); Hyuneok Shin, Gwacheon-si (KR); Yunjong Yeo, Asan-si (KR); Joongeol Lee, Jeollabuk-do (KR)

(73) Assignee: Samsung Display Co., Ltd.

( * ) Notice: Subject to any disclaimer, the term of this patent is extended or adjusted under 35 U.S.C. 154(b) by 42 days.

(21) Appl. No.: 16/709,457

(22) Filed: Dec. 10, 2019

(65) Prior Publication Data

US 2020/0266259 A1 Aug. 20, 2020

(30) Foreign Application Priority Data

Feb. 18, 2019 (KR) .......................... 10-2019-0018505

(51) Int. Cl.
*H01L 27/32* (2006.01)
*H01L 29/49* (2006.01)
*H01L 51/56* (2006.01)

(52) U.S. Cl.
CPC ...... *H01L 27/3276* (2013.01); *H01L 27/3262* (2013.01); *H01L 27/3265* (2013.01); *H01L 29/4958* (2013.01); *H01L 51/56* (2013.01); *H01L 2227/323* (2013.01)

(58) Field of Classification Search
CPC ..... H01L 27/32; H01L 27/326; H01L 27/327; H01L 27/3262; H01L 27/3265; H01L 27/3276; H01L 29/49; H01L 29/495; H01L 29/4958; H01L 51/56
USPC ............................................................ 257/40
See application file for complete search history.

(56) References Cited

U.S. PATENT DOCUMENTS

| | | | |
|---|---|---|---|
| 2004/0183072 A1* | 9/2004 | Kim .................. | H01L 29/41733 257/59 |
| 2005/0072973 A1* | 4/2005 | Kim ....................... | H01L 27/12 257/59 |
| 2015/0295092 A1* | 10/2015 | Misaki ................ | H01L 29/7869 257/43 |

(Continued)

FOREIGN PATENT DOCUMENTS

KR 10-2006-0118202 A 11/2016

*Primary Examiner* — Fazli Erdem
(74) *Attorney, Agent, or Firm* — Innovation Counsel LLP

(57) ABSTRACT

A display device includes a first signal line including a first layer disposed on a substrate and containing aluminum (Al), a second layer disposed on the first layer and containing titanium nitride ($TiN_x$), and a third layer disposed on the second layer and containing titanium (Ti), a second signal line crossing the first signal line, a first transistor including a first gate electrode connected to the first signal line and a first source electrode connected to the second signal line, and an organic light emitting diode disposed in a display area of the substrate to generate light corresponding to a data signal applied to the second signal line.

15 Claims, 11 Drawing Sheets

(56) References Cited

U.S. PATENT DOCUMENTS

2017/0352718 A1* 12/2017 Kim ................ H01L 29/41733
2019/0115369 A1*  4/2019 Lee .................. H01L 21/2855
2019/0165083 A1*  5/2019 Lee .................. H01L 23/5283
2020/0111854 A1*  4/2020 Chung .............. H01L 27/1237

* cited by examiner

DISPLAY DEVICE AND METHOD OF MANUFACTURING THE DISPLAY DEVICE

CROSS-REFERENCE TO RELATED APPLICATION

This application claims priority under 35 USC § 119 to Korean Patent Application No. 10-2019-0018505 filed on Feb. 18, 2019 in the Korean Intellectual Property Office (KIPO), the entire disclosure of which is incorporated herein by reference.

BACKGROUND

1. Field

The present inventive concept relates to a display device and a method of manufacturing the display device. More particularly, the present inventive concept relates to a display device including low-resistance signal lines and signal electrodes, and a method of manufacturing the display device.

2. Description of the Related Art

With the rapid development of a display device for visually expressing various electrical signal information, various flat panel display devices having excellent properties such as lower thickness, lighter weight, and lower power consumption have been used. Among the flat panel display devices, liquid crystal display devices and organic light emitting diode display devices are widely commercialized due to their excellent resolution, image quality, etc. Particularly, because the organic light emitting diode display device has a high response speed, low power consumption, a self-light emission function, and an excellent viewing angle, the organic light emitting diode display device has been spotlighted as a next-generation flat panel display device.

Recently, there is an increasing demand for a display device having high resolution. Accordingly, research is being conducted to increase the number of pixels per unit area. Meanwhile, in order to rapidly process a video signal applied to a high-resolution display device, the necessity of a low-resistance conductive line is increasing. To this end, research has been conducted on a method of using aluminum (Al) or the like as a material of a conductive line to replace conventional molybdenum (Mo) or the like.

SUMMARY

Some example embodiments provide a display device including low-resistance signal lines and signal electrodes Some example embodiments provide a method of manufacturing the display device.

According to example embodiments, a display device may include a first signal line including a first layer disposed on a substrate and containing aluminum (Al), a second layer disposed on the first layer and containing titanium nitride ($TiN_x$), and a third layer disposed on the second layer and containing titanium (Ti), a second signal line crossing the first signal line, a first transistor including a first gate electrode connected to the first signal line and a first source electrode connected to the second signal line, and an organic light emitting diode disposed in a display area of the substrate to generate light corresponding to a data signal applied to the second signal line.

In example embodiments, the first layer may include an aluminum alloy containing nickel (Ni) and lanthanum (La).

In example embodiments, the nickel (Ni) may range from about 0.01 at % to about 0.05 at %, the lanthanum (La) may range from about 0.02 at % to about 0.05 at %, and a total amount of the nickel (Ni) and the lanthanum (La) in the aluminum alloy may be less than 0.1 at %.

In example embodiments, a composition ratio (N/Ti) of the titanium nitride ($TiN_x$) contained in the second layer may be 0.9<N at %/Ti at %<1.2.

In example embodiments, a thickness of the second layer may be between about 150 Å and about 400 Å.

In example embodiments, a thickness of the third layer may be between about 400 Å and about 1000 Å.

In example embodiments, the first gate electrode may include a first layer containing aluminum (Al) or an aluminum alloy, a second layer disposed on the first layer and containing titanium nitride ($TiN_x$), and a third layer disposed on the second layer and containing titanium (Ti).

In example embodiments, the display device may further include a capacitor including a first capacitor electrode and a second capacitor electrode disposed on the first capacitor electrode while overlapping the first capacitor electrode. In addition, each of the first and second capacitor electrodes may include a first layer containing aluminum (Al) or an aluminum alloy, a second layer disposed on the first layer and containing titanium nitride ($TiN_x$), and a third layer disposed on the second layer and containing titanium (Ti).

In example embodiments, the third layer of the first capacitor electrode may have a thickness equal to a thickness of the third layer of the first gate electrode. In addition, the third layer of the second capacitor electrode may have a thickness thicker than a thickness of the third layer of the first gate electrode.

In example embodiments, the display device may further include a second transistor connected to the capacitor. In addition, a second gate electrode of the second transistor may include a first layer containing aluminum (Al) or an aluminum alloy, a second layer disposed on the first layer and containing titanium nitride ($TiN_x$), and a third layer disposed on the second layer and containing titanium (Ti). Further, the third layer of the second gate electrode may have a thickness equal to a thickness of the third layer of the second capacitor electrode.

In example embodiments, the display device may further include a pad electrode disposed in a peripheral area surrounding the display area. In addition, the pad electrode may include a first layer containing aluminum (Al) or an aluminum alloy, a second layer disposed on the first layer and containing titanium nitride ($TiN_x$), and a third layer disposed on the second layer and containing titanium (Ti).

In example embodiments, each of the first signal line, the first gate electrode, the first capacitor electrode, the second capacitor electrode, the second gate electrode, and the pad electrode may further include a fourth layer disposed on the third layer and containing titanium (Ti).

In example embodiments, a thickness of the fourth layer may be between about 50 Å and about 400 Å.

According to example embodiments, a method of manufacturing a display device may include forming a first signal line including a first layer disposed on a substrate and containing aluminum (Al), a second layer disposed on the first layer and containing titanium nitride ($TiN_x$), and a third layer disposed on the second layer and containing titanium (Ti), forming a second signal line crossing the first signal line, forming a first transistor including a gate electrode connected to the first signal line and a source electrode connected to the second signal line, and forming an organic light emitting diode in a display area of the substrate.

In example embodiments, the second layer and the third layer may be formed on the first layer by a continuous deposition process.

In example embodiments, a composition ratio (N/Ti) of the titanium nitride ($TiN_x$) contained in the second layer may be 0.9<N at %/Ti at %<1.2.

In example embodiments, the gate electrode may include a first layer containing aluminum (Al) or an aluminum alloy, a second layer disposed on the first layer and containing titanium nitride ($TiN_x$), and a third layer disposed on the second layer and containing titanium (Ti).

In example embodiments, the method may further include forming a capacitor including a first capacitor electrode and a second capacitor electrode disposed on the first capacitor electrode while overlapping the first capacitor electrode. In addition, each of the first and second capacitor electrodes may include a first layer containing aluminum (Al) or an aluminum alloy, a second layer disposed on the first layer and containing titanium nitride ($TiN_x$), and a third layer disposed on the second layer and containing titanium (Ti). Further, the third layer of the first capacitor electrode may have a thickness equal to a thickness of the third layer of the gate electrode, and the third layer of the second capacitor electrode may have a thickness thicker than a thickness of the third layer of the gate electrode.

In example embodiments, the method may further include forming a pad electrode disposed in a peripheral area surrounding the display area. In addition, the pad electrode may include a first layer containing aluminum (Al) or an aluminum alloy, a second layer disposed on the first layer and containing titanium nitride ($TiN_x$), and a third layer disposed on the second layer and containing titanium (Ti).

In example embodiments, the forming of each of the first signal line, the gate electrode, the first capacitor electrode, the second capacitor electrode, and the pad electrode may include forming a fourth layer containing titanium (Ti) on the third layer. In addition, the second layer, the third layer, and the fourth layer may be formed on the first layer by a continuous deposition process.

Therefore, a display device and a method of manufacturing the display device according to embodiments may obtain specific resistance characteristics substantially the same as the specific resistance characteristics of aluminum even after a heat treatment process and a buffered oxide etch (BOE) process by forming signal lines and signal electrodes using a conductive layer including a first layer including aluminum or an aluminum alloy, a second layer including titanium nitride, and a third layer including titanium. As a result, low-resistance signal lines and signal electrodes of a display device may be implemented.

DETAILED DESCRIPTION OF THE EMBODIMENTS

Figure 1:
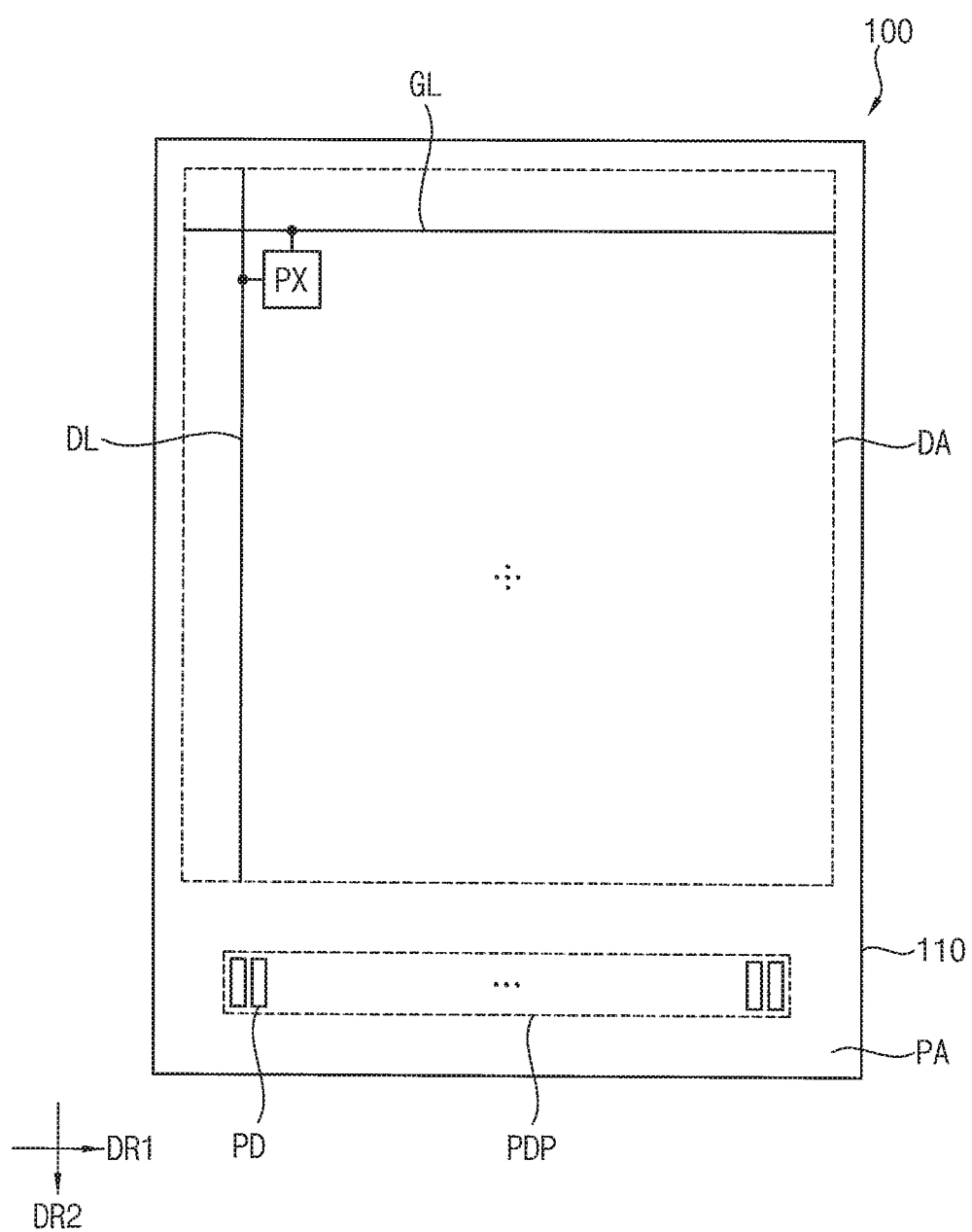
FIG. 1 is a planar diagram for describing a display device according to example embodiments.

FIG. 1 is a planar diagram for describing a display device according to example embodiments.

Referring to FIG. 1, a display device 100 according to one embodiment of the present inventive concept includes a substrate 110 and a plurality of pixels PX.

The substrate 110 may include a display area DA and a peripheral area PA surrounding the display area DA.

In the display area DA, the pixels PX including organic light emitting diodes may be arranged, and a plurality of first signal lines GL and a plurality of second signal lines DL connected to the pixels may be arranged.

The plurality of first signal lines GL may be a plurality of gate lines connected to a plurality of transistors arranged in the display area DA, the plurality of second signal lines DL may be a plurality of data lines connected to source (and drain) electrodes of the transistors.

The plurality of first signal lines GL may extend in a first direction DR1, and may be arranged in a second direction DR2 crossing the first direction DR1. The plurality of second signal lines DL may extend in the second direction DR2, and may be arranged in the first direction DR1.

Each of the pixels PX may be disposed in a region in which one of the first signal lines GL crosses one of the second signal lines DL, and the each of the pixels PX may be connected to a respective first signal line GL and a respective second signal line DL to receive a gate signal and a data signal, which are driving signals, respectively. Each of the pixels PX may be driven in response to the gate signal, and may generate light of a luminance corresponding to the data signal.

Therefore, the display area DA may display an image using the pixels PX.

The peripheral area PA may include a pad part PDP on which a plurality of pad electrodes PD connected to an external device to provide driving signals to the pixels PX are arranged. The external device may include a driving chip, a flexible circuit film on which the driving chip is mounted, etc. In addition, driving circuits for providing the driving signals to the pixels PX may be directly integrated in the peripheral area PA.

The driving signal may include a gate signal provided to the first signal line GL and a data signal provided to the second signal line DL. In addition, the driving signal may include a plurality of power supply signals provided to the pixels PX. For example, the driving signal may include a first power supply signal ELVDD and a second power supply signal ELVSS.

For example, a gate driving circuit for generating a gate signal may be integrated in the peripheral area PA. In addition, the external device including a data driving circuit for generating the data signal may be disposed in the pad part PDP in the peripheral area PA.

Figure 2:
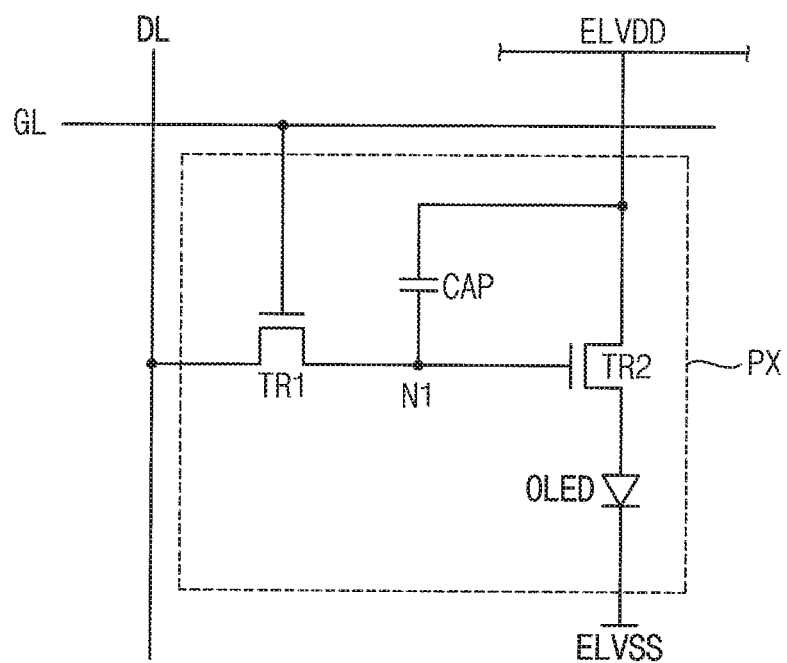
FIG. 2 is a circuit diagram for describing a pixel included in the display device of FIG. 1.

FIG. 2 is a circuit diagram for describing a pixel included in the display device of FIG. 1.

Referring to FIG. 2, the pixel PX may be electrically connected to the first signal line GL, the second signal line DL, the first power supply signal ELVDD, and the second power supply signal ELVSS. In one embodiment, a voltage level of the first power supply signal ELVDD may be higher than a voltage level of the second power supply signal ELVSS.

In one embodiment, the pixel PX may include a first transistor TR1, a second transistor TR2, a capacitor CAP, and an organic light emitting diode OLED, but the present inventive concept is not limited thereto. In other embodiments, the pixel PX may include three or more transistors and/or two or more capacitors. In addition, in other embodiments, components of the pixel PX may be connected differently than the pixel PX shown in FIG. 2.

The first transistor TR1 may have a gate electrode connected to the first signal line GL, a source electrode connected to the second signal line DL, and a drain electrode connected to a first node N1.

The second transistor TR2 may have a gate electrode coupled to the first node N1, a source electrode coupled to the first power supply signal ELVDD, and a drain electrode coupled to the organic light emitting diode OLED.

The capacitor CAP may have a first capacitor electrode connected to the first node N1 and a second capacitor electrode connected to the first power supply signal ELVDD.

The organic light emitting diode OLED may have an anode connected to the second transistor TR2 and a cathode connected to the second power ELVSS.

When the first transistor TR1 is turned on by the gate signal transmitted from the first signal line GL, the first transistor TR1 transmits the data signal transmitted from the second signal line DL to the first node N1. The second transistor TR2 provides a driving current to the organic light emitting diode OLED based on a voltage stored in the capacitor CAP which is a voltage difference between the data signal applied to the first node N1 and the first power supply signal ELVDD. The organic light emitting diode OLED emits light based on the driving current.

Figure 3:
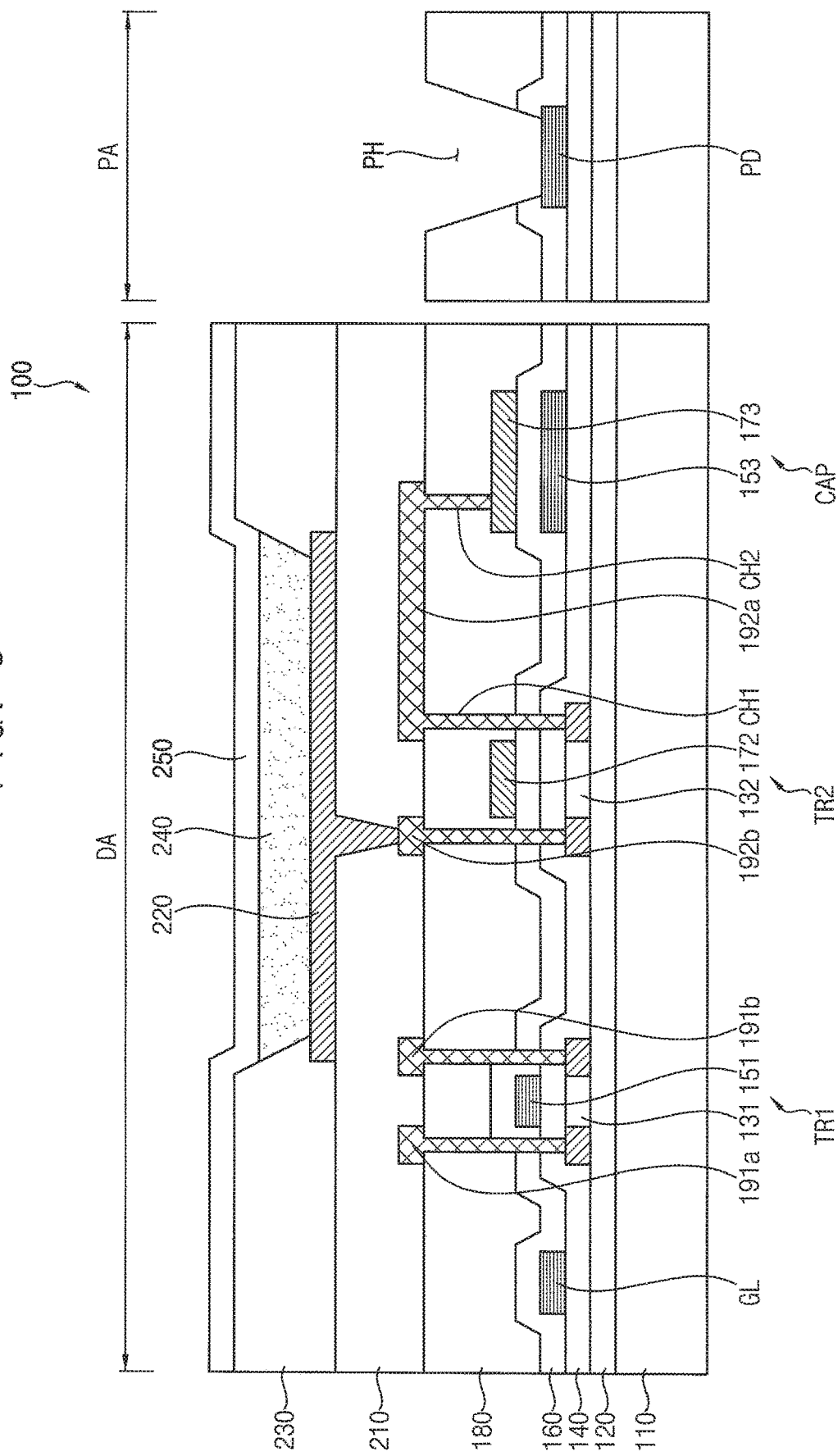
FIG. 3 is a cross-sectional diagram for describing a display device according to example embodiments.
Figure 4:
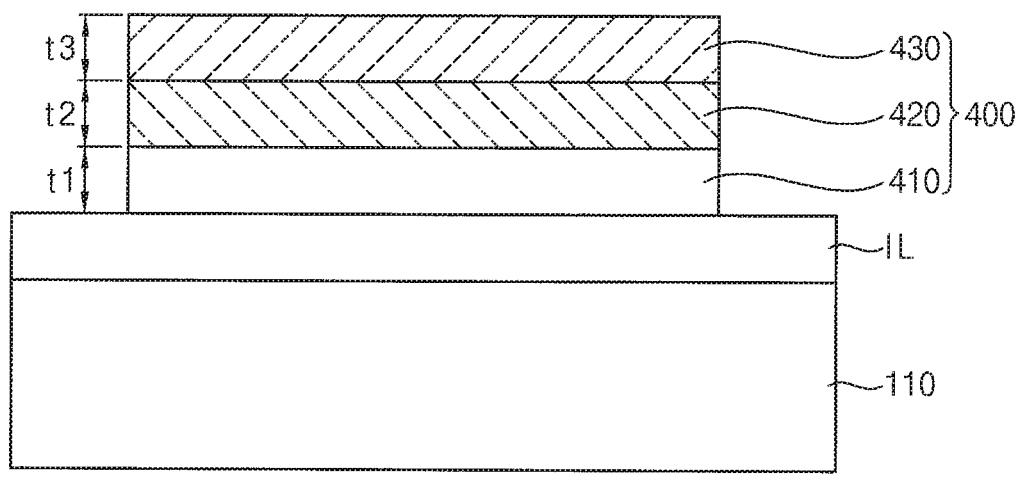
FIG. 4 is a cross-sectional diagram for describing a conductive pattern included in the display device of FIG. 3.

FIG. 3 is a cross-sectional diagram for describing a display device according to example embodiments, and FIG. 4 is a cross-sectional diagram for describing a conductive pattern included in the display device of FIG. 3.

Referring to FIGS. 2 and 3, the display device 100 includes the substrate 110. The pixel PX may be formed on the display area DA of the substrate 110, and a pad electrode PD may be formed in the peripheral area PA of the substrate 110.

The substrate 110 may be an insulating substrate including glass, quartz, plastic, etc.

A buffer layer 120 may be disposed on the substrate 110.

The buffer layer 120 may block impurities such as oxygen and moisture from penetrating through the substrate 110 into the pixel. In addition, the buffer layer 120 may provide a flat surface on a top of the substrate 110. The buffer layer 120 may be an inorganic insulating layer including silicon nitride, silicon oxide, silicon oxynitride, etc. Alternatively, the buffer layer 120 may be omitted.

Semiconductor layers 131 and 132 may be disposed on the buffer layer 120.

The semiconductor layers 131 and 132 may include a first semiconductor 131 corresponding to the first transistor TR1 and a second semiconductor 132 corresponding to the second transistor TR2. The semiconductor layers 131 and 132 may be formed of amorphous silicon, polycrystalline silicon, oxide semiconductor, etc.

In one embodiment, the semiconductor layers 131 and 132 may be formed of polycrystalline silicon. Each of the first semiconductor 131 and the second semiconductor 132 may include a source region, a drain region, and a channel region formed between the source region and the drain region.

A first insulating layer 140 may be disposed on the semiconductor layers 131 and 132.

The first insulating layer 140 may be disposed on the buffer layer 120 to cover the semiconductor layers 131 and 132. The first insulating layer 140 may be an inorganic insulating layer including silicon nitride, silicon oxide, silicon oxynitride, etc. In one embodiment, the first insulating layer 140 may be a silicon oxide layer having a thickness between about 600 Å and about 1400 Å.

Referring to FIG. 4, a first conductive pattern 400 patterned from a first conductive layer including a plurality of layers 410, 420, and 430 may be disposed on the insulating layer IL. The first conductive pattern 400 may include the first signal line GL, a first gate electrode 151 of the first transistor TR1, a first capacitor electrode 153 of the capacitor CAP, and the pad electrode PD.

The first signal line GL may be formed integrally with the first gate electrode 151. The first gate electrode 151 may overlap the channel region of the first semiconductor 131. The pad electrode PD may be formed in the peripheral area PA, and may be exposed by a pad hole PH formed by etching a plurality of insulating layers. Therefore, a terminal of the external device may be connected to the pad electrode PD exposed through the pad hole PH by a conductive adhesive film such as an anisotropic conductive film.

The first conductive pattern 400 may include the plurality of layers 410, 420, and 430.

A first layer 410 may include a metal having lower resistivity, for example, aluminum (Al) or an aluminum alloy. The first layer 410 may serve as a main conductive layer of the first conductive pattern 400. In one embodiment, the first layer 410 may include an aluminum alloy. After a heat treatment process, a resistance of the aluminum alloy may be substantially equal to a resistance of aluminum (Al). The aluminum alloy may contain nickel (Ni) and lanthanum (La). In this case, the nickel (Ni) may range from about 0.01 at % to about 0.05 at %, the lanthanum (La) may range from about 0.02 at % to about 0.05 at %, and a total amount of the nickel (Ni) and the lanthanum (La) in the aluminum alloy may be less than 0.1 at %. In one embodiment, a thickness t1 of the first layer 410 may be between about 1000 Å and about 1800 Å.

A second layer 420 may include refractory metal nitride, for example, titanium nitride ($TiN_x$). The second layer 420 may prevent the aluminum (Al) contained in the first layer 410 from being diffused and may prevent aluminum hillocks from being generated during the heat treatment process after forming the first conductive pattern 400. In one embodiment, a thickness t2 of the second layer 420 may be between about 150 Å and about 400 Å, taking into consideration the diffusion of the aluminum or the aluminum alloy of the first layer 410.

In addition, the second layer 420 may prevent the first layer 410 including the aluminum (Al) from being damaged by a hydrofluoric acid etchant (HF etchant) during a buffered oxide etch process (BOE process). In one embodiment, a composition ratio (N/Ti) of the titanium nitride ($TiN_x$), which is a ratio of a number of nitrogen atoms to a number of titanium atoms, may be set to 0.9 (Ti-rich)<N at %/Ti at %<1.2 (N-rich). In one embodiment, the second thickness t2 of the second layer 420 may be greater than or equal to about 50 Å to prevent the first layer 410 including the aluminum (Al) from being damaged during the BOE process.

A third layer 430 may include titanium (Ti). The third layer 430 may suppress generation of particles due to nitrogen ($N_2$) contained in the second layer 420. In one embodiment, a third thickness t3 of the third layer 430 may be between about 500 Å and about 800 Å, taking into consideration of loss during the subsequent etching process. In one embodiment, the second layer 420 and the third layer 430 may be formed in a chamber by a continuous deposition process (e.g., without breaking a vacuum).

As shown in FIG. 3, a second insulating layer 160 may be disposed on the first conductive pattern 400 including the first signal line GL, the first gate electrode 151 of the first transistor TR1, the first capacitor electrode 153 of the capacitor CAP, and the pad electrode PD. The second insulating layer 160 may be an inorganic insulating layer including silicon nitride, silicon oxide, silicon oxynitride, etc. In one embodiment, the second insulating layer 160 may be a silicon nitride layer having a thickness between about 600 Å and about 1400 Å.

Second conductive patterns 172 and 173 patterned from the second conductive layer may be disposed on the second insulating layer 160.

The second conductive patterns 172 and 173 may include a second gate electrode 172 of the second transistor TR2 and a second capacitor electrode 173 of the capacitor CAP. The second gate electrode 172 may overlap the channel region of the second semiconductor 132. The second capacitor electrode 173 may overlap the first capacitor electrode 153. The first capacitor electrode 153 and the second capacitor electrode 173 may form the capacitor CAP.

The second conductive patterns 172 and 173 may be patterned from the second conductive layer including the same layers as the first conductive layer, for example, the first layer 410, the second layer 420, and the third layer 430 described with reference to FIG. 4.

According to one embodiment, the first layers 410 of the second conductive patterns 172 and 173 may include aluminum (Al) or an aluminum alloy. In one embodiment, the thickness t1 of the first layer 410 may be between about 1000 Å and about 1800 Å.

According to one embodiment, the second layers 420 of the second conductive patterns 172 and 173 may include titanium nitride ($TiN_x$). In one embodiment, the thickness t2 of the second layer 420 may be between about 150 Å and about 400 Å, taking into consideration the diffusion of the aluminum of the first layer 410.

According to one embodiment, the third layers 430 of the second conductive patterns 172 and 173 may include titanium (Ti). According to one embodiment, the third thickness t3 of the third layer 430 may be between about 500 Å and about 1000 Å, taking into consideration film loss during the subsequent etching process. In one embodiment, the second layers 420 and the third layers 430 of the second conductive patterns 172 and 173 may be formed by a continuous deposition process.

A third insulating layer 180 may be disposed on the second conductive patterns 172 and 173. The third insulating layer 180 may be disposed on the second insulating layer 160 to cover the second conductive patterns 172 and 173. The third insulating layer 180 may be an inorganic insulating layer including silicon nitride, silicon oxide, silicon oxynitride or the like, or an organic insulating layer including an acrylic resin, an epoxy-based resin, a polyimide-based resin, a polyester-based resin or the like.

A third conductive pattern patterned from the third conductive layer may be disposed on the third insulating layer 180. The third conductive pattern may include the second signal line DL, a first source electrode 191a and a first drain electrode 191b of the first transistor TR1, and a second source electrode 192a and a second drain electrode 192b of the second transistor TR2.

The second signal line DL may cross the first signal line GL, and may be formed integrally with the first source electrode 191a of the first transistor TR1.

The first source electrode 191a and the first drain electrode 191b may respectively make contact with the source region and the drain region of the first semiconductor 131 through contact holes formed through the first insulating layer 140, the second insulating layer 160, and the third insulating layer 180.

The second source electrode 192a may make contact with the source region of the second semiconductor 132 through a first contact hole CH1 exposing a part of the second semiconductor 132, and may make contact with the second capacitor electrode 173 through a second contact hole CH2 exposing a part of the second capacitor electrode 173. The first contact hole CH1 may be formed through the first insulating layer 140, the second insulating layer 160, and the third insulating layer 180, and the second contact hole CH2 may be formed through the third insulating layer 180.

The second drain electrode 192b may make contact with the drain region of the second semiconductor 132 through the contact hole formed through the first insulating layer 140, the second insulating layer 160, and the third insulating layer 180.

The first semiconductor 131, the first gate electrode 151, the first source electrode 191a, and the first drain electrode 191b may form the first transistor TR1, and the second semiconductor 132, the second gate electrode 172, the second source electrode 192a, and the second drain electrode 192b may form the second transistor TR2.

A fourth insulating layer 210 may be disposed on the third conductive patterns DL, 191a, 191b, 192a, and 192b. The fourth insulating layer 210 may be disposed on the third insulating layer 180 to cover the third conductive patterns DL, 191a, 191b, 192a, and 192b. The fourth insulating layer 210 may provide a flat surface on a top of the third conductive patterns DL, 191a, 191b, 192a, and 192b. The fourth insulating layer 210 may be an organic insulating layer including an acrylic resin, an epoxy-based resin, a polyimide-based resin, a polyester-based resin or the like, or an inorganic insulating layer including silicon nitride, silicon oxide, silicon oxynitride or the like.

A pixel electrode 220 may be disposed on the fourth insulating layer 210.

The pixel electrode 220 may be formed for each pixel. The pixel electrode 220 may be electrically connected to the second transistor TR2 through a contact hole formed in the fourth insulating layer 210. The pixel electrode 220 may include metal and/or transparent conductive oxide, etc.

A fifth insulating layer 230 may be disposed on the pixel electrode 220.

The fifth insulating layer 230 may be disposed on the fourth insulating layer 210 to cover edges of the pixel electrode 220. The fifth insulating layer 230 may include an opening exposing a part of the pixel electrode 220. For example, the opening of the fifth insulating layer 230 may expose a central portion of the pixel electrode 220. Accordingly, the fifth insulating layer 230 may define a light emitting region corresponding to the central portion of the pixel electrode 220. The fifth insulating layer 230 may include an organic insulating material such as an acrylic resin, an epoxy-based resin, a polyimide-based resin, and a polyester-based resin.

A light emitting layer 240 may be disposed on the pixel electrode 220.

The light emitting layer 240 may be disposed on the pixel electrode 220 exposed by the opening of the fifth insulating layer 230. The light emitting layer 240 may emit light by recombination of injected electrons and holes.

In one embodiment, a hole injection layer (HIL) for injecting holes and/or a hole transport layer (HTL) having excellent hole transportability and suppressing movement of electrons which are not combined with the holes in the light emitting layer 240 to increase an opportunity of recombination of the holes and the electrons may be disposed between the pixel electrode 220 and the light emitting layer 240.

In one embodiment, a hole blocking layer (HBL) for suppressing movement of holes which are not combined with the electrons in the light emitting layer 240, an electron transport layer (ETL) for smoothly transporting the electrons to the light emitting layer 240, and/or an electron injection layer (EIL) for injecting the electrons may be disposed on the light emitting layer 240.

A common electrode 250 may be disposed on the light emitting layer 240. The common electrode 250 may be formed commonly on a plurality of pixels. The common electrode 250 may include metal, transparent conductive oxide, etc. The pixel electrode 220, the light emitting layer 240, and the common electrode 250 may form the organic light emitting diode OLED.

In one embodiment, the pixel electrode 220 may be an anode of the organic light emitting diode OLED, and the common electrode 250 may be a cathode of the organic light emitting diode OLED, but the present inventive concept is not limited thereto. In another embodiment, the pixel electrode 220 may be the cathode of the organic light emitting diode OLED, and the common electrode 250 may be the anode of the organic light emitting diode OLED.

Hereinafter, a method of manufacturing a display device including low-resistance signal lines and signal electrodes according to one embodiment of the present inventive concept will be described with reference to FIGS. 3 and 5 to 9.

FIGS. 5 to 9 are cross-sectional diagrams for describing a method of manufacturing a display device according to example embodiments.

Figure 5:
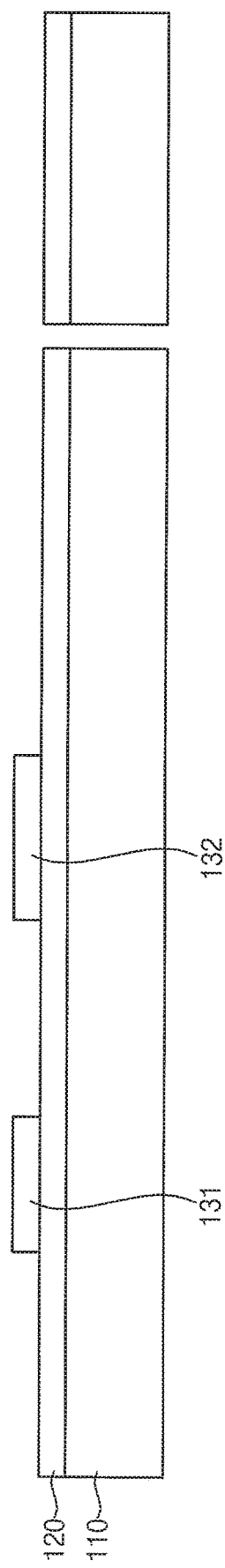
FIGS. 5, 6, 7, 8 and 9 are cross-sectional diagrams for describing a method of manufacturing a display device according to example embodiments.

Referring to FIG. 5, the buffer layer 120 may be formed by depositing an inorganic insulating material on the substrate 110. The semiconductor layers 131 and 132 including the first semiconductor 131 and the second semiconductor 132 may be formed by depositing a semiconductor material on the buffer layer 120 and patterning the deposited semiconductor material.

Figure 6:
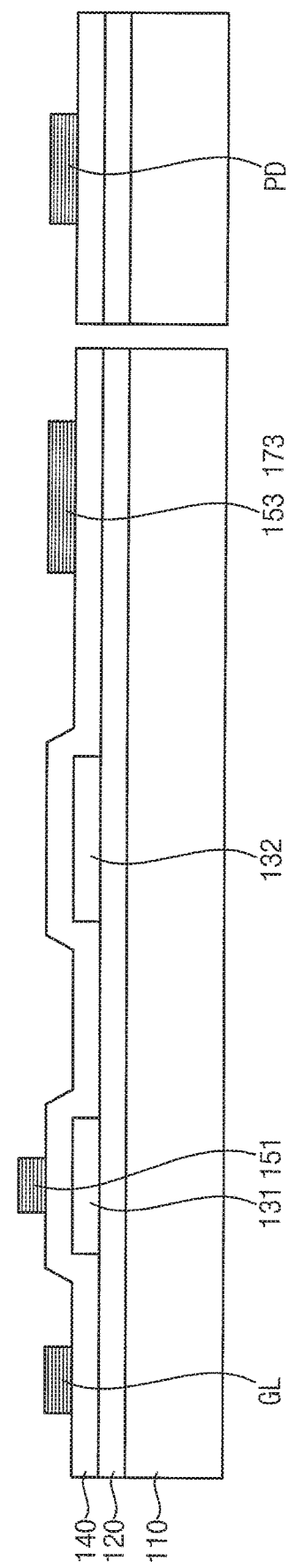

Referring to FIGS. 4 and 6, the first insulating layer 140 may be formed by depositing an inorganic insulating material on the buffer layer 120 on which the semiconductor layers 131 and 132 are formed. The first conductive pattern 400 is formed by depositing a first conductive layer on the first insulating layer 140 and patterning the first conductive layer. The first conductive pattern 400 may include the first signal line GL, the first gate electrode 151, the first capacitor electrode 153 and the pad electrode PD.

Referring to FIG. 4, the first layer 410 is formed by depositing aluminum (Al) or an aluminum alloy on the substrate 110 on which the first insulating layer 140 is formed.

In one embodiment, the first layer 410 may include an aluminum alloy containing nickel (Ni) and lanthanum (La).

In one embodiment, the nickel (Ni) may range from about 0.01 at % to about 0.05 at %, the lanthanum (La) may range from about 0.02 at % to about 0.05 at %, and a total amount of the nickel (Ni) and the lanthanum (La) in the aluminum alloy may be less than 0.1 at %.

In one embodiment, the thickness t1 of the first layer 410 may be between about 1000 Å and about 1800 Å.

Next, the second layer 420 is formed by depositing titanium nitride ($TiN_x$) on the first layer 410, and the third layer 430 is formed by depositing titanium (Ti) on the second layer 420 through a continuous deposition process.

The second layer 420 and the third layer 430 may be formed by using a sputtering system through a continuous process. For example, in the sputtering system, a titanium nitride thin film ($TiN_x$ thin film) may be deposited through a sputtering scheme by using a titanium target (Ti target) and a nitrogen/argon mixed gas ($N_2$/Ar mixed gas) as atmospheric gases the chamber. Subsequently, a titanium thin film (Ti thin film) may be deposited by using the titanium target (Ti target) and only an argon gas (Ar gas) as an atmospheric gas.

In one embodiment, the composition ratio (N/Ti) of the titanium nitride ($TiN_x$), which is a ratio of a number of nitrogen atoms to a number of titanium atoms, may be set to 0.9 (Ti-rich)<N at %/Ti at %<1.2 (N-rich).

In one embodiment, the thickness t2 of the second layer 420 may be between about 150 Å and about 400 Å, taking into consideration the diffusion of the aluminum of the first layer 410. In addition, in one embodiment, the second thickness t2 of the second layer 420 may be greater than or equal to about 50 Å to prevent damage of the first layer 410 due to the HF etchant from occurring.

In one embodiment, the third thickness t3 of the third layer 430 may be between about 500 Å and about 800 Å, taking into consideration film loss during the subsequent etching process.

The first layer 410, the second layer 420 and the third layer 430 may be patterned using a single photolithography process.

Figure 7:
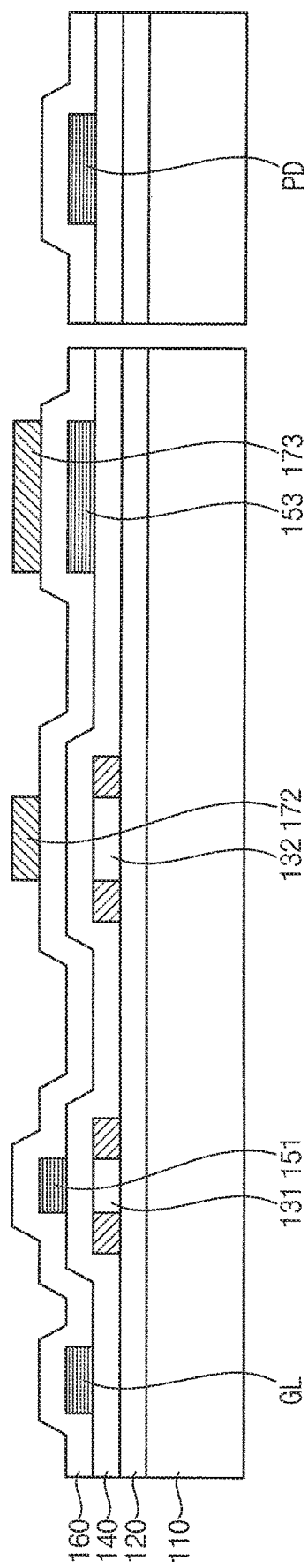

Referring to FIG. 7, the second insulating layer 160 may be formed on the first conductive pattern 400 including the first signal line GL, the first gate electrode 151, the first capacitor electrode 153, and the pad electrode PD.

The second conductive layer is formed on the second insulating layer 160, and the second conductive patterns 172 and 173 are formed by patterning the second conductive layer.

As described in relation to FIG. 4, in order to form the second conductive layer, the first layer 410 is formed by depositing aluminum (Al) or an aluminum alloy, the second layer 420 is formed by depositing titanium nitride ($TiN_x$) on the first layer 410, and the third layer 430 is formed by depositing titanium (Ti) on the second layer 420. The second layer 420 and the third layer 430 are formed through a continuous deposition process.

In one embodiment, the third thickness t3 of the third layer 430 of the second conductive layer may be between about 500 Å and about 1000 Å which is thicker than the third thickness t3 of the third layer 430 of the first conductive pattern, taking into consideration film loss during the subsequent etching process. The first layer 410, the second layer 420 and the third layer 430 may be patterned using a single photolithography process.

The second conductive patterns 172 and 173 may include a second gate electrode 172 of the second transistor TR2 and a second capacitor electrode 173 of the capacitor CAP. The second gate electrode 172 may overlap the channel region of the second semiconductor 132. The second capacitor electrode 173 may overlap the first capacitor electrode 153. The first capacitor electrode 153 and the second capacitor electrode 173 may form the capacitor CAP.

After the second conductive patterns 172 and 173 are formed on the substrate 110, impurities are doped into the first and second semiconductors 131 and 132 by using the first conductive patterns GL, 151, 153, and PD and the second conductive patterns 172 and 173 as masks. Accordingly, each of the first and second semiconductors 131 and 132 may include the source region, the channel region, and the drain region.

After the impurity doping process, an annealing process may be performed on the substrate 110.

In the annealing process, the first layer 410 containing the aluminum (Al) or the aluminum alloy of the first and second conductive patterns may be covered by the second layer 420 containing the titanium nitride ($TiN_x$) to prevent the aluminum from being diffused. Accordingly, sheet resistances of the first conductive patterns GL, 151, 153, and PD and the second conductive patterns 172 and 173 may be prevented from being increased by the heat treatment process.

Figure 8:
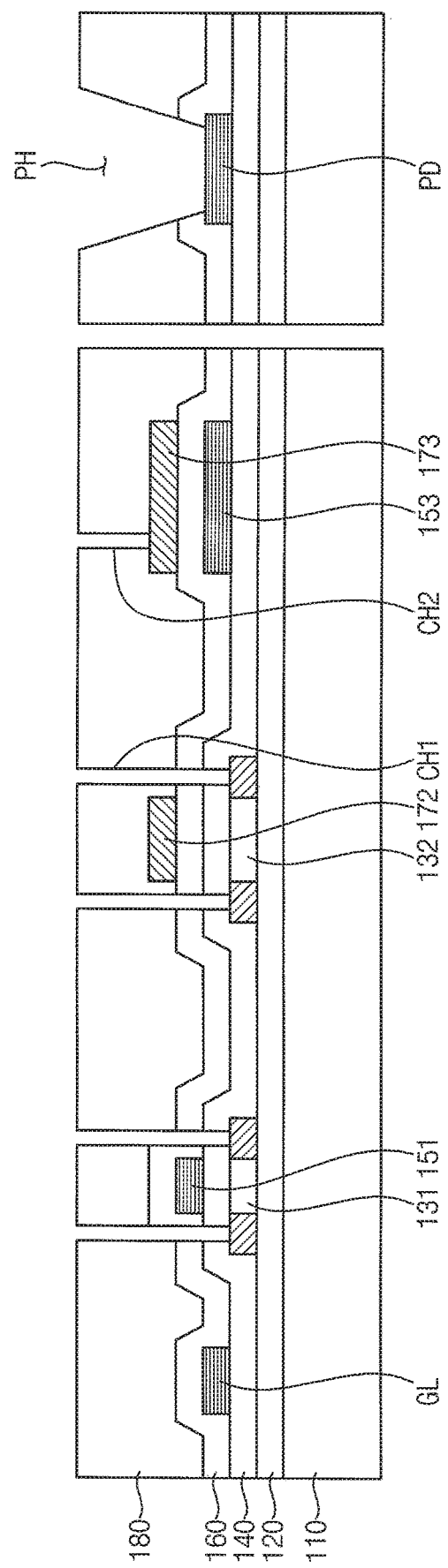

Referring to FIG. 8, the third insulating layer 180 may be formed by depositing an organic insulating material or an inorganic insulating material on the second insulating layer 160 on which the second conductive patterns 172 and 173 are formed. The contact holes including the first contact hole CH1 may be formed by etching the third insulating layer 180, the second insulating layer 160, and the first insulating layer 140, and the second contact hole CH2 may be formed by etching the third insulating layer 180. In addition, the pad hole PH exposing the pad electrode PD may be formed by etching the third insulating layer 180 and the second insulating layer 160.

The first contact hole CH1, the second contact hole CH2, and the pad hole PH may be formed at the same time using a single mask.

When comparing the first conductive patterns GL, 151, 153, and PD with the second conductive patterns 172 and 173, a time for which the second conductive patterns 172 and 173 are exposed to the etching process is longer, so that film damage of the second conductive patterns 172 and 173 may be greater than film damage of the first conductive patterns GL, 151, 153, and PD. Accordingly, the third thickness t3 of the third layers 430 of the second conductive patterns 172 and 173 may be thicker than a thickness of the third layers of the first conductive patterns GL, 151, 153, and PD.

Accordingly, in one embodiment, the thickness t3 of the third layers 430 of the first conductive patterns GL, 151, 153, and PD may be between about 500 Å and about 800 Å, and the third thickness t3 of the third layers 430 of the second conductive patterns 172 and 173 may be between about 500 Å and about 1000 Å.

After the etching process for forming the contact holes CH1 and CH2 and the pad hole PH, the heat treatment process and the BOE process may be performed. The BOE process is a process for removing an oxide film formed on the first and second semiconductors 131 and 132 exposed through the contact hole during the heat treatment process. The BOE process is a wet etching process using an HF etchant.

In the BOE process, the first layers 410 of the first conductive pattern and the second conductive pattern which includes the aluminum or the aluminum alloy is prevented from being exposed to the HF etchant, thus the first layers 410 of the first conductive pattern and the second conductive pattern may be prevented from being damaged by the HF etchant. In one embodiment, the second thickness t2 of the second layers 420 of the first and second conductive patterns may be greater than or equal to about 50 Å to prevent damage due to the HF etchant from occurring during the BOE process.

Figure 9:
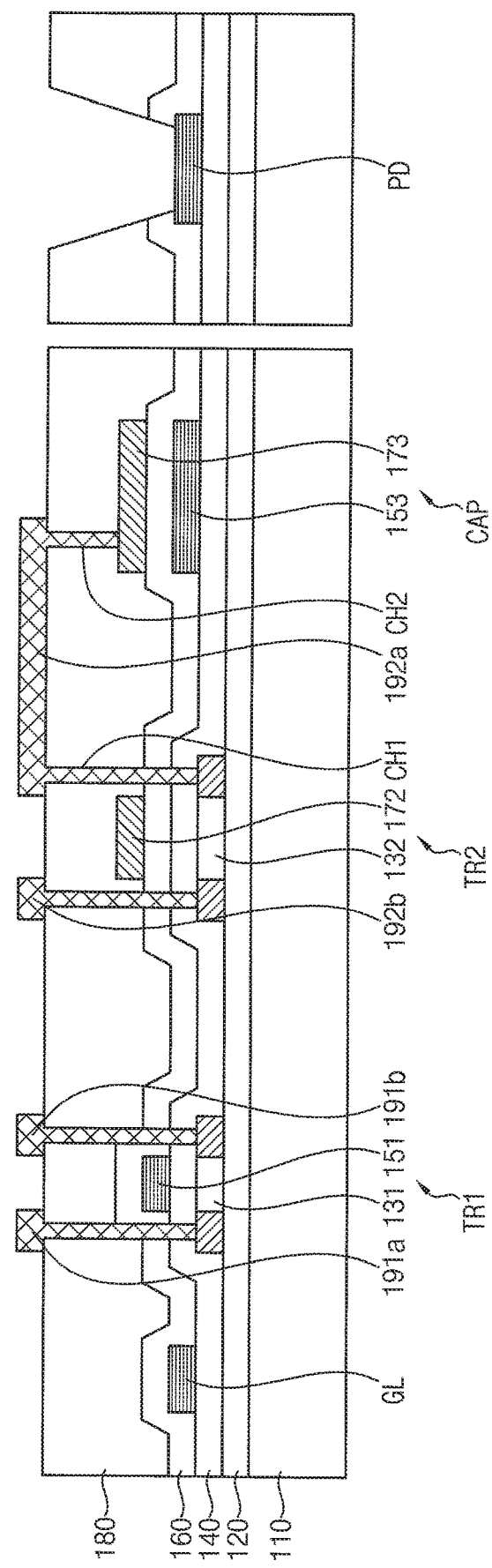

Referring to FIG. 9, a third conductive layer is formed on the substrate 110 on which the contact holes CH1 and CH2 and the pad hole PH are formed, and the third conductive patterns DL, 191a, 191b, 192a, and 192b are formed by patterning the third conductive layer.

The third conductive layer may include a plurality of layers. For example, the third conductive layer may include a first layer containing titanium (Ti), a second layer containing aluminum, and a third layer containing titanium (Ti).

The third conductive patterns DL, 191a, 191b, 192a, and 192b may include the second signal line DL, the first source electrode 191a, the first drain electrode 191b, the second source electrode 192a, and the second drain electrode 192b.

The second signal line DL may cross the first signal line GL, and may transmit a data signal to a pixel. The first source electrode 191a may be connected to the source region of the first semiconductor 131 through the first contact hole CH1, and the first drain electrode 191b may be connected to the drain region of the first semiconductor 131 through the first contact hole CH1.

The second source electrode 192a may be connected to the source region of the second semiconductor 132 through the first contact hole CH1, and the second drain electrode 192b may be connected to the drain region of the second semiconductor 132 through the first contact hole CH1.

Therefore, the first transistor TR1 including the first semiconductor 131, the first gate electrode 151, the first source electrode 191a, and the first drain electrode 191b may be formed, and the second transistor TR2 including the second semiconductor 132, the second gate electrode 172, the second source electrode 192a, and the second drain electrode 192b may be formed.

In one embodiment, a first portion of the second drain electrode 192b may be connected to the drain region of the second semiconductor 132 through the first contact hole CH1, and a second portion of the second drain electrode 192b may be connected to the second capacitor electrode 173 through the second contact hole CH2.

Next, referring to FIG. 3, the fourth insulating layer 210 exposing a part of the second drain electrode 192b may be formed by depositing an organic insulating material or an inorganic insulating material on the substrate 110 on which the third conductive patterns DL, 191a, 191b, 192a, and 192b are formed and patterning the deposited material.

The pixel electrode 220 may be formed by depositing a conductive material such as metal and/or transparent conductive oxide on the fourth insulating layer 210 and patterning the deposited material.

The fifth insulating layer 230 exposing a part of the pixel electrode 220 may be formed by depositing an organic insulating material on the fourth insulating layer 210 on which the pixel electrode 220 is formed and patterning the deposited material.

The light emitting layer 240 may be formed by depositing an organic material on the exposed pixel electrode 220.

The common electrode 250 may be formed by depositing a conductive material such as metal and transparent conductive oxide on the light emitting layer 240 and the fifth insulating layer 230. Therefore, the organic light emitting diode OLED including the pixel electrode 220, the light emitting layer 240, and the common electrode 250 may be formed.

Hereinafter, elements which are the same as the elements of the previous embodiment will be denoted by the same reference numerals, and the redundant descriptions thereof will be omitted or simplified.

Figure 10:
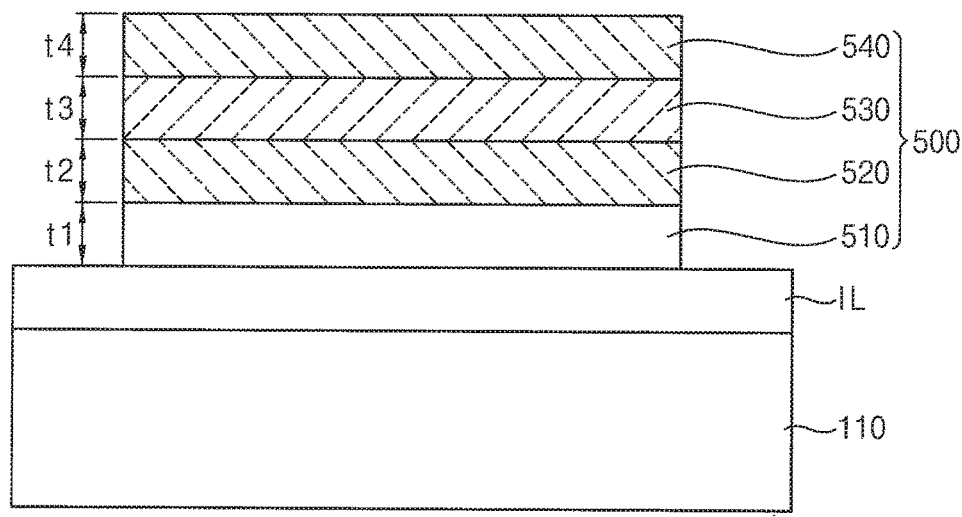
FIG. 10 is a cross-sectional diagram for describing a conductive pattern included in a display device according to example embodiments.

FIG. 10 is a cross-sectional diagram for describing a conductive pattern included in a display device according to example embodiments.

Referring to FIGS. 3 and 10, a first conductive pattern 500 patterned from a first conductive layer may be disposed on the insulating layer IL. The first conductive pattern 500 may include the first signal line GL, the first gate electrode 151 of the first transistor TR1, the first capacitor electrode 153 of the capacitor CAP, and the pad electrode PD. The first signal line GL may be formed integrally with the first gate electrode 151. The first gate electrode 151 may overlap the channel region of the first semiconductor 131.

The first conductive pattern 500 may include a plurality of layers 510, 520, 530, and 540.

A first layer 510 may include aluminum (Al) or an aluminum alloy. The first layer 510 may serve as a main conductive layer of the first conductive pattern 500. In one embodiment, the first layer 510 may be formed of an aluminum alloy. After a heat treatment process, a resistance of the aluminum alloy may be substantially equal to a resistance of aluminum (Al). The aluminum alloy may contain nickel (Ni) and lanthanum (La). In this case, the nickel (Ni) may range from about 0.01 at % to about 0.05 at %, the lanthanum (La) may range from about 0.02 at % to about 0.05 at %, and a total amount of the nickel (Ni) and the lanthanum (La) in the aluminum alloy may be less than 0.1 at %. In one embodiment, a thickness t1 of the first layer 510 may be between about 1000 Å and about 1800 Å.

A second layer 420 may include titanium nitride ($TiN_x$). The second layer 420 may prevent the aluminum (Al) contained in the first layer 510 from being diffused and may prevent a hillock of the aluminum from being generated during the subsequent heat treatment process.

In one embodiment, a thickness t2 of the second layer 520 may be between about 150 Å and about 400 Å, taking into consideration the diffusion of the aluminum or the aluminum alloy of the first layer 510.

In addition, the second layer 520 may protect the aluminum (Al) contained in the first layer 510 from being damaged by the HF etchant during the subsequent etching process, for example, the BOE process. In one embodiment, a composition ratio (N/Ti) of the titanium nitride ($TiN_x$), which is a ratio of a number of nitrogen atoms to a number of titanium atoms, may be set to 0.9 (Ti-rich)<N at %/Ti at %<1.2 (N-rich). In one embodiment, the second thickness t2 of the second layer 520 may be greater than or equal to about 50 Å to prevent damage due to the HF etchant from occurring during the BOE process.

A third layer 530 may include titanium (Ti). The third layer 530 may suppress generation of particles due to nitrogen ($N_2$) contained in the second layer 520.

In one embodiment, a third thickness t3 of the third layer 530 may be between about 400 Å and about 800 Å, taking into consideration film loss during the subsequent etching process.

In one embodiment, the third thickness t3 of the third layers 530 of the second conductive patterns 171 and 173 may be between about 400 Å and about 1000 Å, taking into consideration film loss during the subsequent etching process.

A fourth layer 540 may include titanium nitride ($TiN_x$). The fourth layer 540 may prevent the titanium (Ti) contained in the third layer 530 from being oxidized by combining with oxygen in the air. Titanium oxide obtained by oxidizing the titanium (Ti) may not be etched during an etching process (e.g., dry etching process) for patterning the conductive layer, thereby causing defects in the conductive pattern. In order to improve such defects, the titanium oxide may be prevented from being formed by depositing the fourth layer 540 containing the titanium nitride ($TiN_x$) on the third layer 530.

In one embodiment, the second layer 520, the third layer 530, and the fourth layer 540 may be formed through a continuous deposition process. For example, in the sputtering system, first, a titanium nitride thin film ($TiN_x$ thin film) may be deposited by using a metal titanium target (metal Ti target) using a nitrogen and argon mixed gas ($N_2$/Ar mixed gas) as atmospheric gases. Subsequently, a titanium thin film (Ti thin film) may be deposited by using the metal titanium target (metal Ti target) and argon gas (Ar gas) as atmospheric gas, and a $TiN_x$ thin film may be deposited by using the metal titanium target (metal Ti target) and an $N_2$ and Ar mixed gas as atmospheric gases.

In one embodiment, a fourth thickness t4 of the fourth layer 540 may be between about 50 Å and about 400 Å, taking into consideration damage of the first layer including aluminum during the BOE process.

Figure 11:
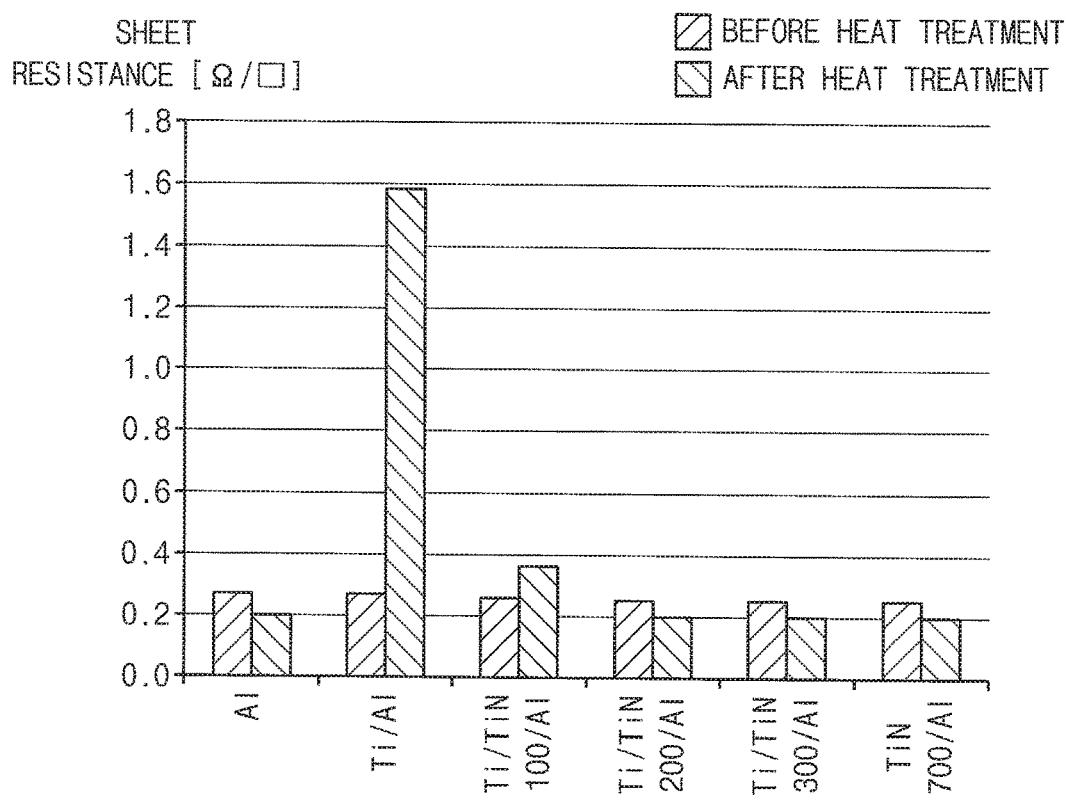
FIG. 11 is a graph for describing resistance characteristics of conductive patterns after an annealing process.

FIG. 11 is a graph for describing resistance characteristics of conductive patterns after an annealing process.

Referring to FIG. 11, a conductive pattern (Al) of Comparative Example 1 is formed as a single layer including aluminum, and a conductive pattern (Ti/Al) of Comparative Example 2 includes a first layer including aluminum and a second layer including titanium.

A conductive pattern (Ti/TiN100/Al) of Example 1 includes a first layer including aluminum, a second layer including titanium nitride having a thickness of about 100 Å and a third layer including titanium, and a conductive pattern (Ti/TiN200/Al) of Example 2 includes a first layer including aluminum, a second layer including titanium nitride having a thickness of about 200 Å and a third layer including titanium.

FIG. 11 shows sheet resistances ($\Omega/\square$) measured, for conductive patterns of Comparative Examples and Examples, before and after heat treatment.

In the conductive pattern (Al) of Comparative Example 1, the sheet resistance ($\Omega/\square$) after the heat treatment has rarely changed as compared with the sheet resistance ($\Omega/\square$) before the heat treatment.

In the conductive pattern (Ti/Al) of Comparative Example 2, the sheet resistance after the heat treatment has sharply increased as compared with the sheet resistance before the heat treatment. During the heat treatment process, in the conductive pattern (Ti/Al) of Comparative Example 2, diffusion occurs at an interface between the first layer including aluminum (Al) and the second layer including titanium (Ti), and such interface diffusion causes an increase in the resistance of the conductive pattern (Ti/Al).

In the conductive pattern (Ti/TiN100/Al) of Example 1, the sheet resistance ($\Omega/\square$) after the heat treatment has rarely changed as compared with the sheet resistance ($\Omega/\square$) before the heat treatment.

In addition, in the conductive pattern (Ti/TiN200/Al) of Example 2, the sheet resistance ($\Omega/\square$) after the heat treatment has rarely changed as compared with the sheet resistance ($\Omega/\square$) before the heat treatment, and the conductive pattern (Ti/TiN200/Al) of Example 2 has resistance characteristics substantially the same as the resistance characteristics of the conductive pattern (Al) of Comparative Example 1, that is, a conductive pattern formed of a single layer including aluminum.

With reference to the conductive pattern (Ti/TiN100/Al) of Example 1 and the conductive pattern (Ti/TiN200/Al) of Example 2, the second layer including the titanium nitride (TiN) may have specific resistance characteristics substantially the same as the specific resistance characteristics of aluminum by preventing the diffusion of the aluminum.

Meanwhile, the second layer including the titanium nitride (TiN) of Example 1 has a thickness of about 100 Å, and the second layer including the titanium nitride (TiN) of Example 2 has a thickness of about 200 Å.

Referring to the sheet resistance ($\Omega/\Box$) after the heat treatment, the sheet resistance of the conductive pattern (Ti/TiN200/Al) of Example 2 is smaller than the sheet resistance of the conductive pattern (Ti/TiN100/Al). In addition, as shown in FIG. 11, when the thickness of the second layer including the titanium nitride is greater than or equal to about 300 Å, conductive patterns have sheet resistances almost equal to the sheet resistance of the conductive pattern where the thickness of the second layer including the titanium nitride is about 200 Å.

Therefore, considering the sheet resistance characteristics, the second layer of the conductive pattern, which includes the titanium nitride (TiN), may have a thickness greater than or equal to about 150 Å.

Figure 12:
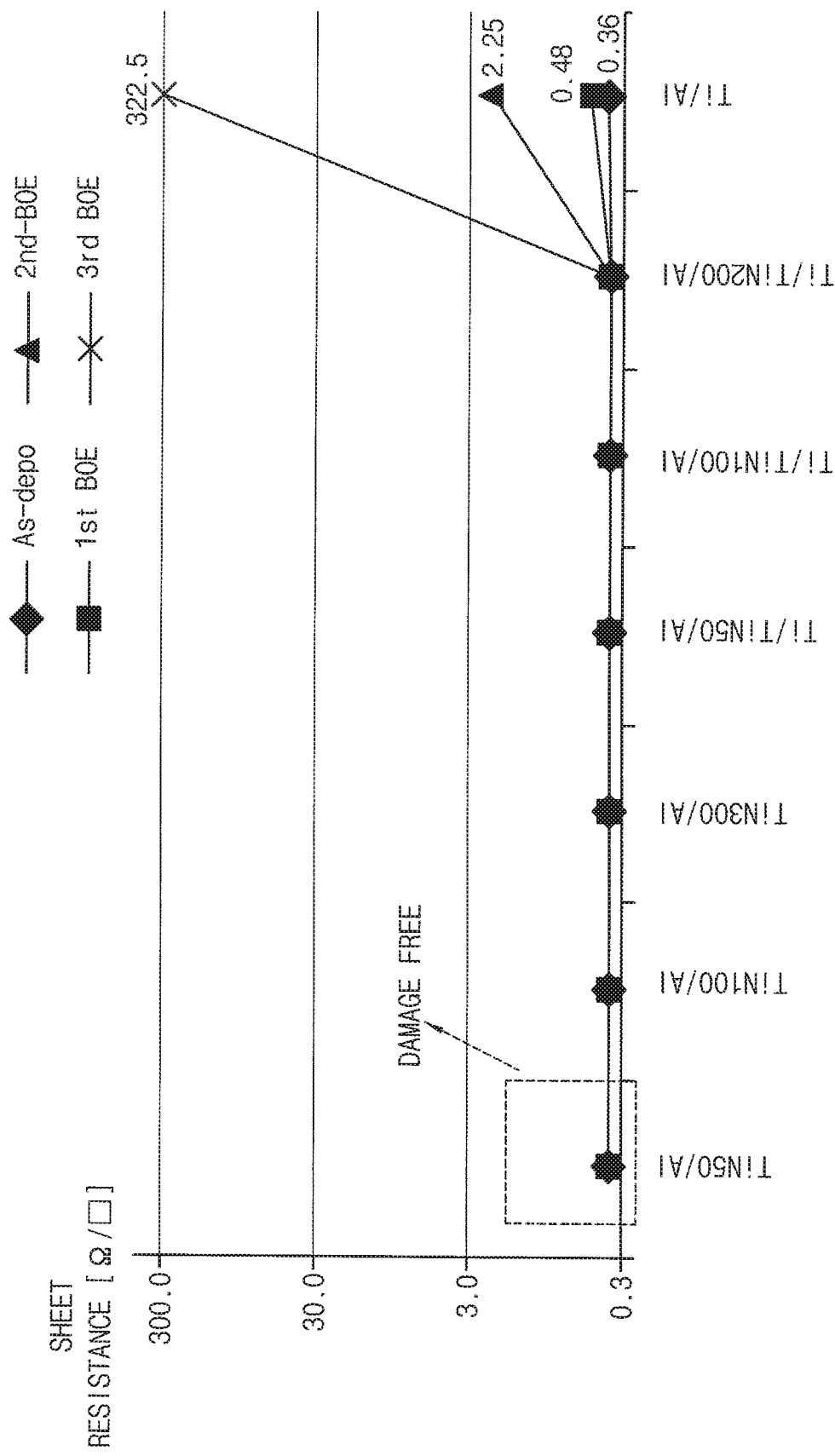
FIG. 12 is a graph for describing resistance characteristics of conductive patterns after a BOE process.

FIG. 12 is a graph for describing resistance characteristics of conductive patterns after a BOE process.

Referring to FIG. 12, a conductive pattern (Ti/Al) of Comparative Example 1 includes a first layer including aluminum and a second layer including titanium, and a conductive pattern (TiN50/Al) of Comparative Example 2 includes a first layer including aluminum and a second layer including titanium nitride having a thickness of about 50 Å.

A conductive pattern of Example 1 (Ti/TiN100/Al) includes a first layer including aluminum, a second layer including titanium nitride having a thickness of about 100 Å and a third layer including titanium, and a conductive pattern of Example 2 (Ti/TiN200/Al) includes a first layer including aluminum, a second layer including titanium nitride having a thickness of about 200 Å and a third layer including titanium.

FIG. 12 shows sheet resistances ($\Omega/\Box$) measured, for the conductive patterns of Comparative Examples and Examples, before the BOE process, after performing the BOE process one time, after performing the BOE process two times, and after performing the BOE process three times.

In the conductive pattern (Ti/Al) of Comparative Example 1, the sheet resistance before the BOE process is about 0.36 ($\Omega/\Box$), the sheet resistance after performing the BOE process one time is about 0.46 ($\Omega/\Box$), the sheet resistance after performing the BOE process two times is about 2.25 ($\Omega/\Box$), and the sheet resistance after performing the BOE process three times is greater than or equal to about 322.5 ($\Omega/\Box$).

In the conductive pattern (Ti/Al) of Comparative Example 1, the sheet resistance has sharply increased as the BOE process is performed repeatedly. After performing the BOE process three times, the conductive pattern (Ti/Al) of Comparative Example 1 has a resistance that causes the conductive pattern (Ti/Al) to hardly serve as a signal line.

The sheet resistance of the conductive pattern (TiN50/Al) of Comparative Example 2 is about 0.3 ($\Omega/\Box$) before the BOE process and after performing the BOE process one time, two times, and three times. The second layer including the titanium nitride (TiN) prevents the first layer including the aluminum from being damaged by the HF etchant during the BOE process. With reference to the conductive pattern (TiN50/Al) of Comparative Example 2, when the second layer including the titanium nitride (TiN) has a thickness of about 50 Å, the first layer including the aluminum may be prevented from being damaged by the BOE process.

The sheet resistance of the conductive pattern (Ti/TiN100/Al) of Example 1 is about 0.3 ($\Omega/\Box$) before the BOE process and after performing the BOE process one time, two times, and three times, and the sheet resistance of the conductive pattern (Ti/TiN200/Al) of Example 2 is also about 0.3 ($\Omega/\Box$) before the BOE process and after performing the BOE process one time, two times, and three times. The second layer including the titanium nitride (TiN) prevents the first layer including the aluminum from being damaged by the HF etchant during the BOE process.

In addition, with reference to the conductive patterns of Comparative Example 2, Example 1, and Example 2, the second layer including the titanium nitride (TiN) may prevent the first layer including the aluminum from being damaged by the HF etchant during the BOE process regardless of the presence or absence of the third layer including the titanium. In addition, the sheet resistance after the BOE process is almost equal to the sheet resistance before the process when the thickness of the second layer including the titanium nitride (TiN) is greater than or equal to about 50 Å.

Therefore, considering the damage caused by the BOE process, the second layer including the titanium nitride (TiN) may have a thickness greater than or equal to about 50 Å.

According to the above embodiments of the present inventive concept, the display device may be formed such that signal lines and signal electrodes are formed using a conductive layer including a first layer including aluminum or an aluminum alloy, a second layer including titanium nitride, and a third layer including titanium, so that specific resistance characteristics substantially the same as the specific resistance characteristics of aluminum may be obtained even after the heat treatment process and the BOE process. Therefore, low-resistance signal lines and signal electrodes of the display device may be implemented.

The present inventive concept may be applied to a display device. For example, the present inventive concept may be applied to a display device included in a computer, a laptop, a cellular phone, a smart phone, a smart pad, a portable multimedia player (PMP), a personal digital assistant (PDA), an MP3 player, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a first signal line including a first layer disposed on a substrate and containing aluminum (Al), a second layer disposed on the first layer and containing titanium nitride (TiN$_x$), and a third layer disposed on the second layer and containing titanium (Ti);
a second signal line crossing the first signal line;
a first transistor including a first gate electrode connected to the first signal line and a first source electrode connected to the second signal line, wherein the first gate electrode includes a first layer containing aluminum (Al) or an aluminum alloy, a second layer disposed on the first layer and containing titanium nitride (TiN$_x$), and a third layer disposed on the second layer and containing titanium (Ti);
a capacitor including a first capacitor electrode and a second capacitor electrode disposed on the first capacitor electrode while overlapping the first capacitor electrode, wherein each of the first and second capacitor electrodes includes a first layer containing aluminum (Al) or an aluminum alloy, a second layer disposed on the first layer and containing titanium nitride (TiN$_x$), and a third layer disposed on the second layer and containing titanium (Ti); and
an organic light emitting diode disposed in a display area of the substrate to generate light corresponding to a data signal applied to the second signal line,
wherein the third layer of the first capacitor electrode has a thickness equal to a thickness of the third layer of the first gate electrode, and the third layer of the second capacitor electrode has a thickness thicker than a thickness of the third layer of the first gate electrode.

2. The display device of claim 1, wherein the first layer includes an aluminum alloy containing nickel (Ni) and lanthanum (La).

3. The display device of claim 2, wherein the nickel (Ni) ranges from about 0.01 at % to about 0.05 at %, the lanthanum (La) ranges from about 0.02 at % to about 0.05 at %, and a total amount of the nickel (Ni) and the lanthanum (La) in the aluminum alloy is less than 0.1 at %.

4. The display device of claim 1, wherein a composition ratio (N/Ti) of the titanium nitride (TiN$_x$) contained in the second layer is 0.9<N at %/Ti at %<1.2.

5. The display device of claim 1, wherein a thickness of the second layer is between about 150 Å and about 400 Å.

6. The display device of claim 1, wherein a thickness of the third layer is between about 400 Å and about 1000 Å.

7. The display device of claim 1, further comprising:
a second transistor connected to the capacitor,
wherein a second gate electrode of the second transistor includes a first layer containing aluminum (Al) or an aluminum alloy, a second layer disposed on the first layer and containing titanium nitride (TiN$_x$), and a third layer disposed on the second layer and containing titanium (Ti), and
wherein the third layer of the second gate electrode has a thickness equal to a thickness of the third layer of the second capacitor electrode.

8. The display device of claim 7, further comprising:
a pad electrode disposed in a peripheral area surrounding the display area,
wherein the pad electrode includes a first layer containing aluminum (Al) or an aluminum alloy, a second layer disposed on the first layer and containing titanium nitride (TiN$_x$), and a third layer disposed on the second layer and containing titanium (Ti).

9. The display device of claim 8, wherein each of the first signal line, the first gate electrode, the first capacitor electrode, the second capacitor electrode, the second gate electrode, and the pad electrode further includes a fourth layer disposed on the third layer and containing titanium (Ti).

10. The display device of claim 9, wherein a thickness of the fourth layer is between about 50 Å and about 400 Å.

11. A method of manufacturing a display device, the method comprising:
sequentially forming a first signal line including a first layer containing aluminum (Al), a second layer containing titanium nitride (TiN$_x$), and a third layer containing titanium (Ti) on a substrate;
forming a second signal line crossing the first signal line;
forming a first transistor including a gate electrode connected to the first signal line and a source electrode connected to the second signal line;
forming a capacitor including a first capacitor electrode and a second capacitor electrode disposed on the first capacitor electrode while overlapping the first capacitor electrode; and
forming an organic light emitting diode in a display area of the substrate,
wherein the gate electrode includes a first layer containing aluminum (Al) or an aluminum alloy, a second layer disposed on the first layer and containing titanium nitride (TiNx), and a third layer disposed on the second layer and containing titanium (Ti),
wherein each of the first and second capacitor electrodes includes a first layer containing aluminum (Al) or an aluminum alloy, a second layer disposed on the first layer and containing titanium nitride (TiNx), and a third layer disposed on the second layer and containing titanium (Ti), and
wherein the third layer of the first capacitor electrode has a thickness equal to a thickness of the third layer of the gate electrode, and the third layer of the second capacitor electrode has a thickness thicker than a thickness of the third layer of the gate electrode.

12. The method of claim 11, wherein the second layer and the third layer are formed on the first layer by a continuous deposition process.

13. The method of claim 11, wherein a composition ratio (N/Ti) of the titanium nitride (TiN$_x$) contained in the second layer is 0.9<N at %/Ti at %<1.2.

14. The method of claim 11, further comprising:
forming a pad electrode disposed in a peripheral area surrounding the display area,
wherein the pad electrode includes a first layer containing aluminum (Al) or an aluminum alloy, a second layer disposed on the first layer and containing titanium nitride (TiN$_x$), and a third layer disposed on the second layer and containing titanium (Ti).

15. The method of claim 14, wherein the forming of each of the first signal line, the gate electrode, the first capacitor electrode, the second capacitor electrode, and the pad electrode includes forming a fourth layer containing titanium (Ti) on the third layer, and
wherein the second layer, the third layer, and the fourth layer are formed on the first layer by a continuous deposition process.

* * * * *